(12) United States Patent
Huang et al.

(10) Patent No.: US 10,510,603 B2
(45) Date of Patent: Dec. 17, 2019

(54) CONDUCTIVE VIAS IN SEMICONDUCTOR PACKAGES AND METHODS OF FORMING SAME

(71) Applicant: Taiwan Semiconductor Manufacturing Company, Ltd., Hsinchu (TW)

(72) Inventors: Sung-Hui Huang, Dongshan Township (TW); Hung-Pin Chang, Hsinchu (TW); Sao-Ling Chiu, Hsinchu (TW); Shang-Yun Hou, Jubei (TW); Wan-Yu Lee, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 15/801,000

(22) Filed: Nov. 1, 2017

(65) Prior Publication Data
US 2019/0067104 A1   Feb. 28, 2019

Related U.S. Application Data

(60) Provisional application No. 62/552,965, filed on Aug. 31, 2017.

(51) Int. Cl.
| | |
|---|---|
| *H01L 21/768* | (2006.01) |
| *H01L 23/00* | (2006.01) |
| *H01L 21/56* | (2006.01) |
| *H01L 25/18* | (2006.01) |
| *H01L 25/00* | (2006.01) |

(Continued)

(52) U.S. Cl.
CPC ...... *H01L 21/76898* (2013.01); *H01L 21/481* (2013.01); *H01L 21/486* (2013.01);
(Continued)

(58) Field of Classification Search
CPC ......... H01L 21/76898; H01L 21/76897; H01L 23/481; H01L 23/3128; H01L 23/3171
See application file for complete search history.

(56) References Cited

U.S. PATENT DOCUMENTS

| | | | |
|---|---|---|---|
| 5,066,612 | A | 11/1991 | Ohba et al. |
| 7,387,961 | B2 | 6/2008 | Tseng et al. |

(Continued)

FOREIGN PATENT DOCUMENTS

| | | |
|---|---|---|
| CN | 1815711 A | 8/2006 |
| CN | 104269390 A | 1/2015 |

(Continued)

*Primary Examiner* — Zandra V Smith
*Assistant Examiner* — John M Parker
(74) *Attorney, Agent, or Firm* — Slater Matsil, LLP

(57) ABSTRACT

An embodiment method includes bonding a first die to a first side of an interposer, the interposer comprising a substrate; after bonding the first die to the first side of the interposer, depositing a first insulating layer on a second side of the interposer opposite the first side; patterning an opening through the substrate and the first insulating layer; and depositing a second insulating layer over the first insulating layer and along sidewalls and a lateral surface of the opening. The second insulating layer comprises silicon. The method further includes removing lateral portions of the second insulating layer to define a sidewall spacer on sidewalls of the opening and forming a through via in the opening, wherein the through via is electrically connected to the first die.

20 Claims, 16 Drawing Sheets

(51) Int. Cl.
*H01L 23/498* (2006.01)
*H01L 21/48* (2006.01)
*H01L 23/48* (2006.01)
*H01L 21/683* (2006.01)
*H01L 23/31* (2006.01)

(52) U.S. Cl.
CPC ........ *H01L 21/4853* (2013.01); *H01L 21/563* (2013.01); *H01L 21/6835* (2013.01); *H01L 23/481* (2013.01); *H01L 23/49811* (2013.01); *H01L 23/49827* (2013.01); *H01L 24/11* (2013.01); *H01L 24/13* (2013.01); *H01L 24/16* (2013.01); *H01L 24/17* (2013.01); *H01L 24/94* (2013.01); *H01L 24/97* (2013.01); *H01L 25/18* (2013.01); *H01L 25/50* (2013.01); *H01L 21/561* (2013.01); *H01L 23/3128* (2013.01); *H01L 2221/68345* (2013.01); *H01L 2221/68359* (2013.01); *H01L 2221/68368* (2013.01); *H01L 2224/10126* (2013.01); *H01L 2224/11019* (2013.01); *H01L 2224/11462* (2013.01); *H01L 2224/11464* (2013.01); *H01L 2224/13021* (2013.01); *H01L 2224/13025* (2013.01); *H01L 2224/16111* (2013.01); *H01L 2224/16145* (2013.01); *H01L 2224/16227* (2013.01); *H01L 2224/1703* (2013.01); *H01L 2224/17181* (2013.01)

(56) References Cited

U.S. PATENT DOCUMENTS

| | | | |
|---|---|---|---|
| 8,283,781 B2 | 10/2012 | Wu et al. | |
| 8,802,504 B1 | 8/2014 | Hou et al. | |
| 8,803,292 B2 | 8/2014 | Chen et al. | |
| 8,803,316 B2 | 8/2014 | Lin et al. | |
| 8,993,380 B2 | 3/2015 | Hou et al. | |
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,496,189 B2 | 11/2016 | Yu et al. | |
| 9,633,869 B2 | 4/2017 | Chiu et al. | |
| 9,633,917 B2 | 4/2017 | Tsai et al. | |
| 9,716,017 B2 | 7/2017 | Oh et al. | |
| 9,839,127 B2 | 12/2017 | Kwon et al. | |
| 9,893,042 B2 | 2/2018 | Yu et al. | |
| 2008/0128882 A1* | 6/2008 | Baek | H01L 21/568 257/686 |
| 2013/0320531 A1 | 12/2013 | Chen et al. | |
| 2015/0102468 A1* | 4/2015 | Kang | H01L 24/97 257/621 |
| 2015/0108642 A1 | 4/2015 | Daubenspeck et al. | |
| 2017/0053844 A1* | 2/2017 | Tsai | H01L 25/0657 |
| 2018/0121345 A1* | 5/2018 | Li | G06F 12/0246 |
| 2018/0166617 A1* | 6/2018 | Ueda | H01L 23/32 |

FOREIGN PATENT DOCUMENTS

| | | |
|---|---|---|
| CN | 104377171 A | 2/2015 |
| CN | 105529324 A | 4/2016 |
| KR | 20170001060 A | 1/2017 |
| KR | 20170022825 A | 3/2017 |
| KR | 20170070800 A | 6/2017 |

* cited by examiner

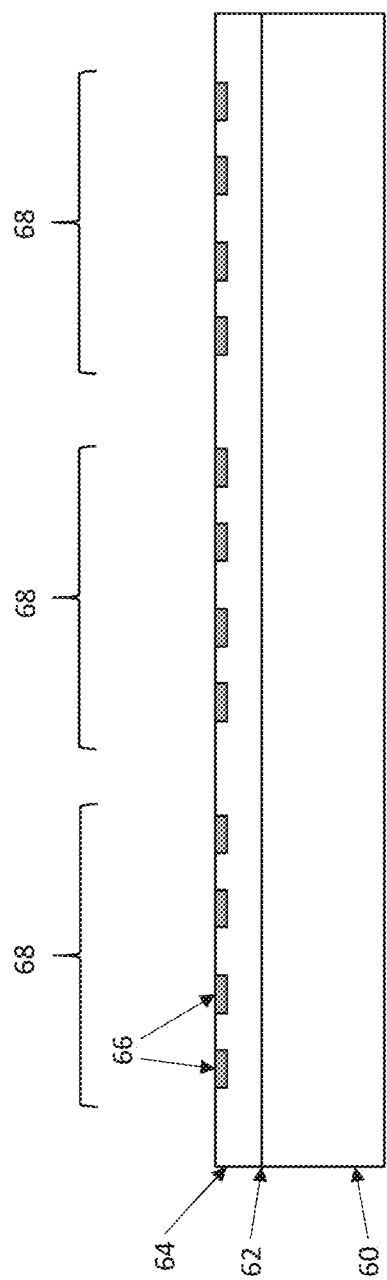
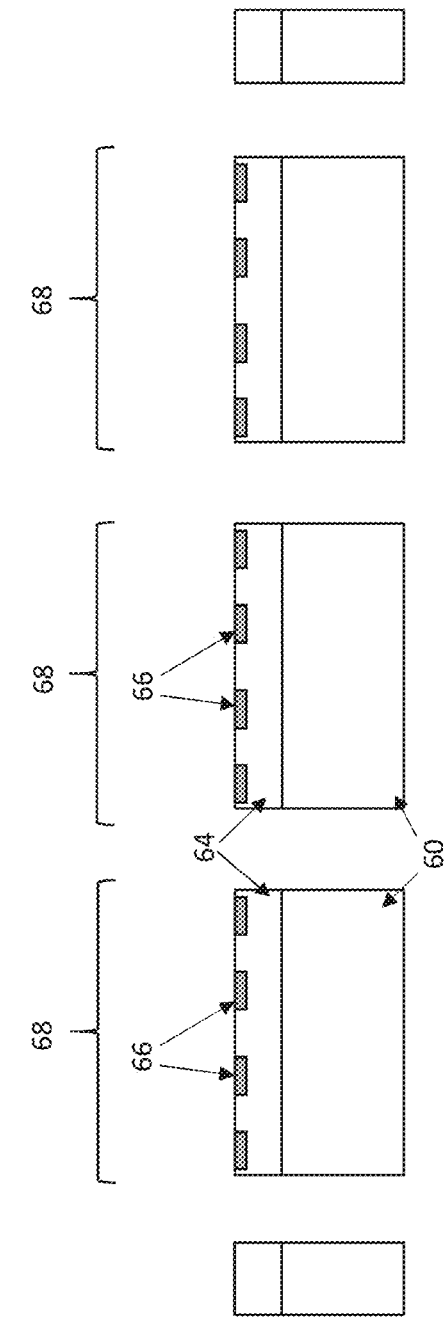

CONDUCTIVE VIAS IN SEMICONDUCTOR PACKAGES AND METHODS OF FORMING SAME

PRIORITY CLAIM AND CROSS-REFERENCE

This patent application claims priority to U.S. Provisional Application No. 62/552,965, filed on Aug. 31, 2017 and entitled "Conductive Vias in Semiconductor Packages and Methods of Forming Same," which application is hereby incorporated by reference herein as if reproduced in its entirety.

BACKGROUND

Since the development of the integrated circuit (IC), the semiconductor industry has experienced continued rapid growth due to continuous improvements in the integration density of various electronic components (i.e., transistors, diodes, resistors, capacitors, etc.). For the most part, these improvements in integration density have come from repeated reductions in minimum feature size, which allows more components to be integrated into a given area.

These integration improvements are essentially two-dimensional (2D) in nature, in that the area occupied by the integrated components is essentially on the surface of the semiconductor wafer. The increased density and corresponding decrease in area of the integrated circuit has generally surpassed the ability to bond an integrated circuit chip directly onto a substrate. Interposers have been used to redistribute ball contact areas from that of the chip to a larger area of the interposer. Further, interposers have allowed for a three-dimensional (3D) package that includes multiple chips. Other packages have also been developed to incorporate 3D aspects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 through 17, 18A, 18B, and 19 through 21 illustrate cross-sectional and top down views of intermediary stages of manufacturing a semiconductor device package in accordance with some embodiments.

DETAILED DESCRIPTION

Figure 3:
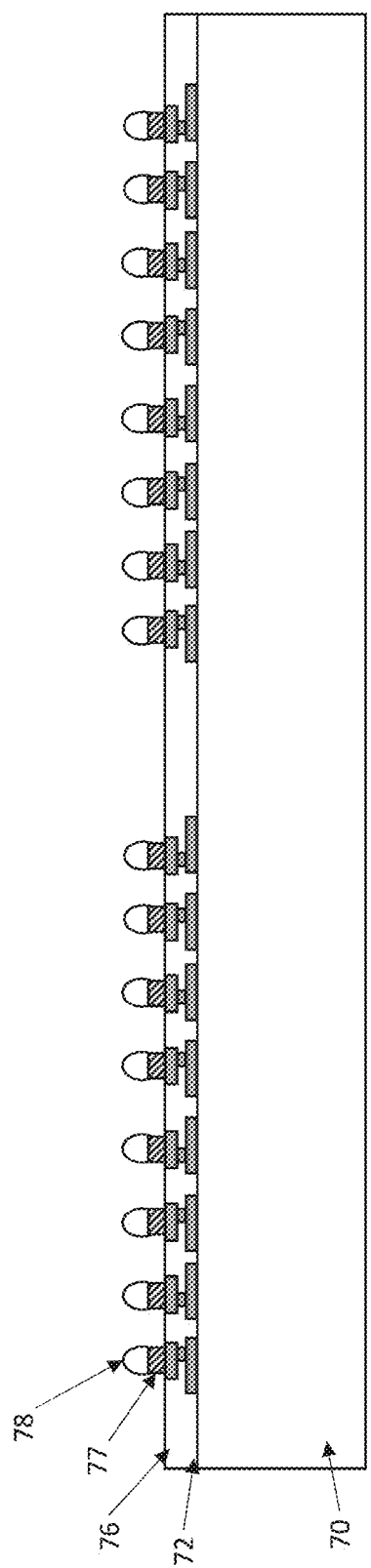

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments include a device package comprising one or more semiconductor chips bonded to an interposer and a package substrate bonded to a side of the interposer opposing the one or more semiconductor chips. In some embodiments, the device package may be referred to a chip-on-wafer-on-substrate (CoWoS) ultra-thin sandwich (UTS) package. The interposer provides electrical routing between the one or more semiconductor chips and the package substrate. For example, the interposer may include a redistribution structure (e.g., comprising conductive lines and/or vias disposed in one or more insulating layers) disposed on a semiconductor substrate. The redistribution structure provides electrical routing to/from the one or more semiconductor chips. Conductive vias may extend through the substrate and are electrically connected to the conductive features of the redistribution structure. In some embodiments, solder regions are disposed on the conductive vias to provide electrical connectors (e.g., microbumps (μbumps)) for bonding to the package substrate.

In order to achieve a small package profile, the semiconductor substrate of the interposer may be thinned during manufacturing. Due to the thinness of the semiconductor substrate, the conductive vias extending through the semiconductor substrate are at an increased risk of deformation (e.g., delamination) during thermal processing of the device package (e.g., reliability/stress testing, reflow/bonding to the package substrate, and the like). Various embodiments provide an insulating spacer on sidewalls of the conductive via to improve the rigidity of the conductive via and reduce manufacturing defects. In some embodiments, the insulating spacer may insulate the conductive via from the semiconductor substrate of the interposer as well as provide increased structure support. For example, the insulating spacer may be a silicon-comprising material, such as, silicon nitride, silicon oxide, silicon oxynitride, or the like. Compared to other insulating materials (e.g., polymers), it has been observed that spacers made of the above materials provide improved structural support.

Embodiments will be described with respect to a specific context, namely a Die-Interposer-Substrate stacked package using Chip-on-Wafer-on-Substrate (CoWoS) processing. Other embodiments may also be applied, however, to other packages, such as a Die-Die-Substrate stacked package, and other processing. Embodiments discussed herein are to provide examples to enable making or using the subject matter of this disclosure, and a person having ordinary skill in the art will readily understand modifications that can be made while remaining within contemplated scopes of different embodiments. Like reference numbers and characters in the figures below refer to like components. Although method embodiments may be discussed as being performed in a particular order, other method embodiments may be performed in any logical order.

FIG. 1 illustrates the formation of one or more die 68. A main body 60 of the dies 68 may comprise any number of dies, substrates, transistors, active devices, passive devices, or the like. In an embodiment, the main body 60 may include a bulk semiconductor substrate, semiconductor-on-insulator (SOI) substrate, multi-layered semiconductor substrate, or the like. The semiconductor material of the main body 60 may be silicon, germanium, a compound semiconductor including silicon germanium, silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The main body 60 may be doped or undoped. Devices, such as transistors, capacitors, resistors, diodes, and the like, may be formed in and/or on an active surface 62.

An interconnect structure 64 comprising one or more dielectric layer(s) and respective metallization pattern(s) is formed on the active surface 62. The metallization pattern(s) in the dielectric layer(s) may route electrical signals between the devices, such as by using vias and/or traces, and may also contain various electrical devices, such as capacitors, resistors, inductors, or the like. The various devices and metallization patterns may be interconnected to perform one or more functions. The functions may include memory structures, processing structures, sensors, amplifiers, power distribution, input/output circuitry, or the like. Additionally, die connectors 66, such as conductive pillars (for example, comprising a metal such as copper), are formed in and/or on the interconnect structure 64 to provide an external electrical connection to the circuitry and devices. In some embodiments, the die connectors 66 protrude from the interconnect structure 64 to form pillar structure to be utilized when bonding the dies 68 to other structures. One of ordinary skill in the art will appreciate that the above examples are provided for illustrative purposes. Other circuitry may be used as appropriate for a given application.

More particularly, an inter-metallization dielectric (IMD) layer may be formed in the interconnect structure 64. The IMD layer may be formed, for example, of a low-K dielectric material, such as undoped silicate glass (USG), phosphosilicate glass (PSG), borophosphosilicate glass (BPSG), fluorosilicate glass (FSG), $SiO_xC_y$, Spin-On-Glass, Spin-On-Polymers, silicon carbon material, compounds thereof, composites thereof, combinations thereof, or the like, by any suitable method known in the art, such as spinning, chemical vapor deposition (CVD), plasma-enhanced CVD (PECVD), high-density plasma chemical vapor deposition (HDP-CVD), or the like. A metallization pattern may be formed in the IMD layer, for example, by using photolithography techniques to deposit and pattern a photoresist material on the IMD layer to expose portions of the IMD layer that are to become the metallization pattern. An etch process, such as an anisotropic dry etch process, may be used to create recesses and/or openings in the IMD layer corresponding to the exposed portions of the IMD layer. The recesses and/or openings may be lined with a diffusion barrier layer and filled with a conductive material. The diffusion barrier layer may comprise one or more layers of tantalum nitride, tantalum, titanium nitride, titanium, cobalt tungsten, the like, or a combination thereof, deposited by atomic layer deposition (ALD), or the like. The conductive material of the metallization patterns may comprise copper, aluminum, tungsten, silver, and combinations thereof, or the like, deposited by CVD, physical vapor deposition (PVD), or the like. Any excessive diffusion barrier layer and/or conductive material on the IMD layer may be removed, such as by using a chemical mechanical polish (CMP).

In FIG. 2, the main body 60 including the interconnect structure 64 is singulated into individual dies 68. Typically, the dies 68 contain the same circuitry, such as devices and metallization patterns, although the dies may have different circuitry. The singulation may include sawing, dicing, or the like.

Each of the dies 68 may include one or more logic dies (e.g., central processing unit, graphics processing unit, system-on-a-chip, field-programmable gate array (FPGA), microcontroller, or the like), memory dies (e.g., dynamic random access memory (DRAM) die, static random access memory (SRAM) die, or the like), power management dies (e.g., power management integrated circuit (PMIC) die), radio frequency (RF) dies, sensor dies, micro-electro-mechanical-system (MEMS) dies, signal processing dies (e.g., digital signal processing (DSP) die), front-end dies (e.g., analog front-end (AFE) dies), the like, or a combination thereof. Also, in some embodiments, the dies 68 may be different sizes (e.g., different heights and/or surface areas), and in other embodiments, the dies 68 may be the same size (e.g., same heights and/or surface areas).

Figure 21:
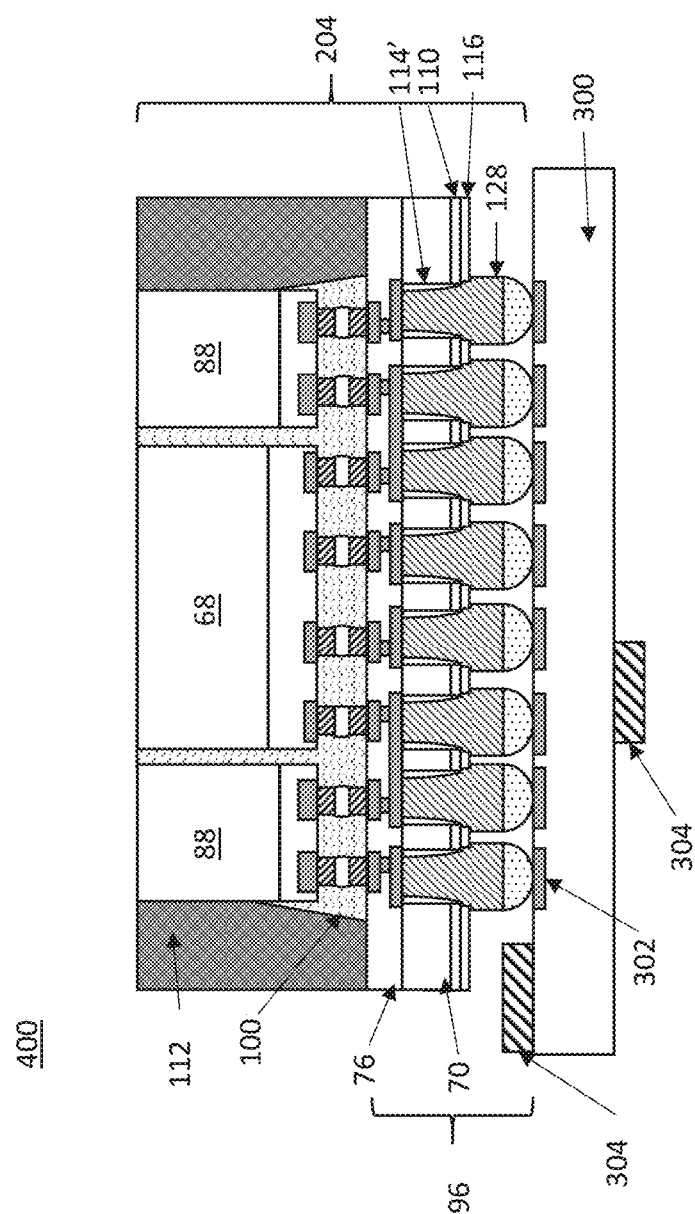

FIG. 3 illustrates the formation of a first side of components 96 (see FIG. 21). A substrate 70 comprises one or more components 96 during processing. The components 96 may be an interposer or another die. The substrate 70 can be a wafer. The substrate 70 may comprise a bulk semiconductor substrate, SOI substrate, multi-layered semiconductor substrate, or the like. The semiconductor material of the substrate 70 may be silicon, germanium, a compound semiconductor including silicon germanium, silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The substrate 70 may be doped or undoped. Devices, such as transistors, capacitors, resistors, diodes, and the like, may be formed in and/or on a first surface 72, which may also be referred to as an active surface, of the substrate 70. In embodiments where component 96 is an interposer, component 96 will generally not include active devices therein, although the interposer may include passive devices formed in and/or on a first surface 72.

Redistribution structure 76 is formed over the first surface 72 of the substrate 70, and is used to electrically connect the integrated circuit devices, if any and/or to external devices. The redistribution structure 76 may include one or more dielectric layer(s) and respective metallization pattern(s) in the dielectric layer(s). The metallization patterns may comprise vias and/or traces to interconnect any devices and/or to an external device. The metallization patterns are sometimes referred to as Redistribution Lines (RDL). The dielectric layers may comprise silicon oxide, silicon nitride, silicon carbide, silicon oxynitride, low-K dielectric material, such as PSG, BPSG, FSG, $SiO_xC_y$, Spin-On-Glass, Spin-On-Polymers, silicon carbon material, compounds thereof, composites thereof, combinations thereof, or the like. The dielectric layers may be deposited by any suitable method known in the art, such as spinning, CVD, PECVD, HDP-CVD, or the like. A metallization pattern may be formed in the dielectric layer, for example, by using photolithography techniques to deposit and pattern a photoresist material on the dielectric layer to expose portions of the dielectric layer that are to become the metallization pattern. An etch process, such as an anisotropic dry etch process, may be used to create recesses and/or openings in the dielectric layer corresponding to the exposed portions of the dielectric layer. The recesses and/or openings may be lined with a diffusion barrier layer and filled with a conductive material. The diffusion barrier layer may comprise one or more layers of TaN, Ta, TiN, Ti, CoW, or the like, deposited by ALD, or the like, and the conductive material may comprise copper, aluminum, tungsten, silver, and combinations thereof, or the like, deposited by CVD, PVD, a plating process, or the like. Any excessive diffusion barrier layer and/or conductive material on the dielectric layer may be removed, such as by using a CMP.

Electrical connectors 77/78 are formed at the top surface of the redistribution structure 76 on conductive pads. In some embodiments, the conductive pads include under bump metallurgies (UBMs). In the illustrated embodiment, the pads are formed in openings of the dielectric layers of the redistribution structure 76. In another embodiment, the pads (UBMs) can extend through an opening of a dielectric layer of the redistribution structure 76 and also extend across the top surface of the redistribution structure 76. As an example to form the pads, a seed layer (not shown) is formed at least in the opening in the dielectric layer of the redistribution structure 76. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the pads. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the pads. In the embodiment, where the pads are formed differently, more photoresist and patterning steps may be utilized.

In some embodiments, the electrical connectors 77/78 include a metal pillar 77 with a metal cap layer 78, which may be a solder cap, over the metal pillar 77. The electrical connectors 77/78 including the pillar 77 and the cap layer 78 are sometimes referred to as μbumps 77/78. In some embodiments, the metal pillars 77 include a conductive material such as copper, aluminum, gold, nickel, palladium, the like, or a combination thereof and may be formed by sputtering, printing, electro plating, electroless plating, CVD, or the like. The metal pillars 77 may be solder free and have substantially vertical sidewalls. In some embodiments, a metal cap layer 78 is formed on the top of the metal pillar 77. The metal cap layer 78 may include nickel, tin, tin-lead, gold, copper, silver, palladium, indium, nickel-palladium-gold, nickel-gold, the like, or a combination thereof and may be formed by a plating process.

In another embodiment, the electrical connectors 77/78 do not include the metal pillars and are solder balls and/or bumps, such as controlled collapse chip connection (C4), electroless nickel immersion Gold (ENIG), electroless nickel electroless palladium immersion gold technique (EN-EPIG) formed bumps, or the like. In this embodiment, the bump electrical connectors 77/78 may include a conductive material such as solder, copper, aluminum, gold, nickel, silver, palladium, tin, the like, or a combination thereof. In this embodiment, the electrical connectors 77/78 are formed by initially forming a layer of solder through suitable methods such as evaporation, electroplating, printing, solder transfer, ball placement, or the like. Once a layer of solder has been formed on the structure, a reflow may be performed in order to shape the material into the desired bump shapes.

Figure 4:
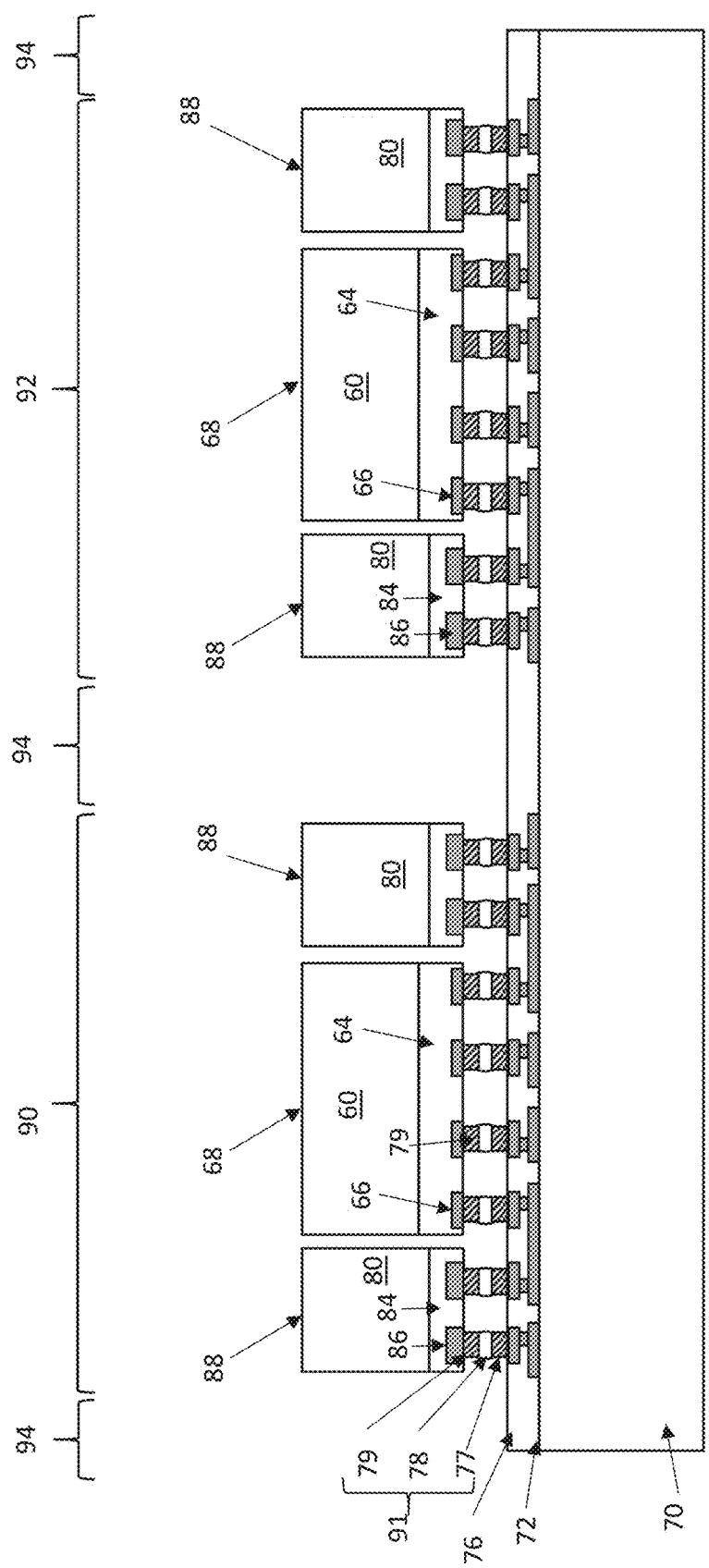

In FIG. 4, the dies 68 and the dies 88 are attached to the first side of the components 96, for example, through flip-chip bonding by way of the electrical connectors 77/78 and the metal pillars 79 on the dies to form conductive joints 91. The metal pillars 79 may be similar to the metal pillars 77 and the description is not repeated herein. The dies 68 and the dies 88 may be placed on the electrical connectors 77/78 using, for example, a pick-and-place tool. In some embodiments, the metal cap layers 78 are formed on the metal pillars 77 (as shown in FIG. 3), the metal pillars 79 of the dies 68 and the dies 88, or both.

The dies 88 may be formed through similar processing as described above in reference to the dies 68. In some embodiments, the dies 88 include one or more memory dies, such as a stack of memory dies (e.g., DRAM dies, SRAM dies, High-Bandwidth Memory (HBM) dies, Hybrid Memory Cubes (HMC) dies, or the like). In the stack of memory dies embodiments, a die 88 can include both memory dies and a memory controller, such as, for example, a stack of four or eight memory dies with a memory controller. Also, in some embodiments, the dies 88 may be different sizes (e.g., different heights and/or surface areas), and in other embodiments, the dies 88 may be the same size (e.g., same heights and/or surface areas).

In some embodiments, the dies 88 may be similar heights to those of the dies 68 (as shown in FIG. 4) or in some embodiments, the dies 68 and 88 may be of different heights.

The dies 88 include a main body 80, an interconnect structure 84, and die connectors 86. The main body 80 of the dies 88 may comprise any number of dies, substrates, transistors, active devices, passive devices, or the like. In an embodiment, the main body 80 may include a bulk semiconductor substrate, semiconductor-on-insulator (SOI) substrate, multi-layered semiconductor substrate, or the like. The semiconductor material of the main body 80 may be silicon, germanium, a compound semiconductor including silicon germanium, silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The main body 80 may be doped or undoped. Devices, such as transistors, capacitors, resistors, diodes, and the like, may be formed in and/or on an active surface.

An interconnect structure 84 comprising one or more dielectric layer(s) and respective metallization pattern(s) is formed on the active surface. The metallization pattern(s) in the dielectric layer(s) may route electrical signals between the devices, such as by using vias and/or traces, and may also contain various electrical devices, such as capacitors, resistors, inductors, or the like. The various devices and metallization patterns may be interconnected to perform one or more functions. The functions may include memory structures, processing structures, sensors, amplifiers, power distribution, input/output circuitry, or the like. Additionally, die connectors 86, such as conductive pillars (for example, comprising a metal such as copper), are formed in and/or on the interconnect structure 84 to provide an external electrical connection to the circuitry and devices. In some embodiments, the die connectors 86 protrude from the interconnect structure 84 to form pillar structure to be utilized when bonding the dies 88 to other structures. One of ordinary skill in the art will appreciate that the above examples are provided for illustrative purposes. Other circuitry may be used as appropriate for a given application.

More particularly, an IMD layer may be formed in the interconnect structure 84. The IMD layer may be formed, for example, of a low-K dielectric material, such as PSG, BPSG, FSG, $SiO_xC_y$, Spin-On-Glass, Spin-On-Polymers, silicon carbon material, compounds thereof, composites thereof, combinations thereof, or the like, by any suitable method known in the art, such as spinning, CVD, PECVD, HDP-CVD, or the like. A metallization pattern may be formed in the IMD layer, for example, by using photolithography techniques to deposit and pattern a photoresist material on the IMD layer to expose portions of the IMD layer that are to become the metallization pattern. An etch process, such as an anisotropic dry etch process, may be used to create recesses and/or openings in the IMD layer corresponding to the exposed portions of the IMD layer. The recesses and/or openings may be lined with a diffusion barrier layer and filled with a conductive material. The diffusion barrier layer may comprise one or more layers of tantalum nitride, tantalum, titanium nitride, titanium, cobalt tungsten, the like, or a combination thereof, deposited by ALD, or the like. The conductive material of the metallization patterns may comprise copper, aluminum, tungsten, silver, and combinations thereof, or the like, deposited by CVD, PVD, or the like. Any excessive diffusion barrier layer and/or conductive material on the IMD layer may be removed, such as by using a CMP.

In the embodiments wherein the die connectors 66 and 86 protrude from the interconnect structures 64 and 84, respectively, the metal pillars 79 may be excluded from the dies 68 and 86 as the protruding die connectors 66 and 86 may be used as the pillars for the metal cap layers 78.

The conductive joints 91 electrically couple the circuits in the dies 68 and the dies 88 through interconnect structures 84 and 64 and die connectors 86 and 66, respectively, to redistribution structure 76 in components 96.

In some embodiments, before bonding the electrical connectors 77/78, the electrical connectors 77/78 are coated with a flux (not shown), such as a no-clean flux. The electrical connectors 77/78 may be dipped in the flux or the flux may be jetted onto the electrical connectors 77/78. In another embodiment, the flux may also be applied to the electrical connectors 79/78. In some embodiments, the electrical connectors 77/78 and/or 79/78 may have an epoxy flux (not shown) formed thereon before they are reflowed with at least some of the epoxy portion of the epoxy flux remaining after the dies 68 and the dies 88 are attached to the components 96. This remaining epoxy portion may act as an underfill to reduce stress and protect the joints resulting from the reflowing the electrical connectors 77/78/79.

The bonding between the dies 68 and 88 and the components 96 may be a solder bonding or a direct metal-to-metal (such as a copper-to-copper or tin-to-tin) bonding. In an embodiment, the dies 68 and the dies 88 are bonded to the components 96 by a reflow process. During this reflow process, the electrical connectors 77/78/79 are in contact with the die connectors 66 and 86, respectively, and the pads of the redistribution structure 76 to physically and electrically couple the dies 68 and the dies 88 to the components 96. After the bonding process, an IMC (not shown) may form at the interface of the metal pillars 77 and 79 and the metal cap layers 78.

FIG. 4 and subsequent figures, a first package region 90 and a second package region 92 for the formation of a first package and a second package, respectively, are illustrated. Scribe line regions 94 are between adjacent package regions. As illustrated in FIG. 4, a first die and multiple second dies are attached in each of the first package region 90 and the second package region 92.

In some embodiments, the dies 68 are system-on-a-chip (SoC) or a graphics processing unit (GPU) and the second dies are memory dies that may utilized by the dies 68. In an embodiment, the dies 88 are stacked memory dies. For example, the stacked memory dies 88 may include low-power (LP) double data rate (DDR) memory modules, such as LPDDR1, LPDDR2, LPDDR3, LPDDR4, or the like memory modules.

Figure 5:
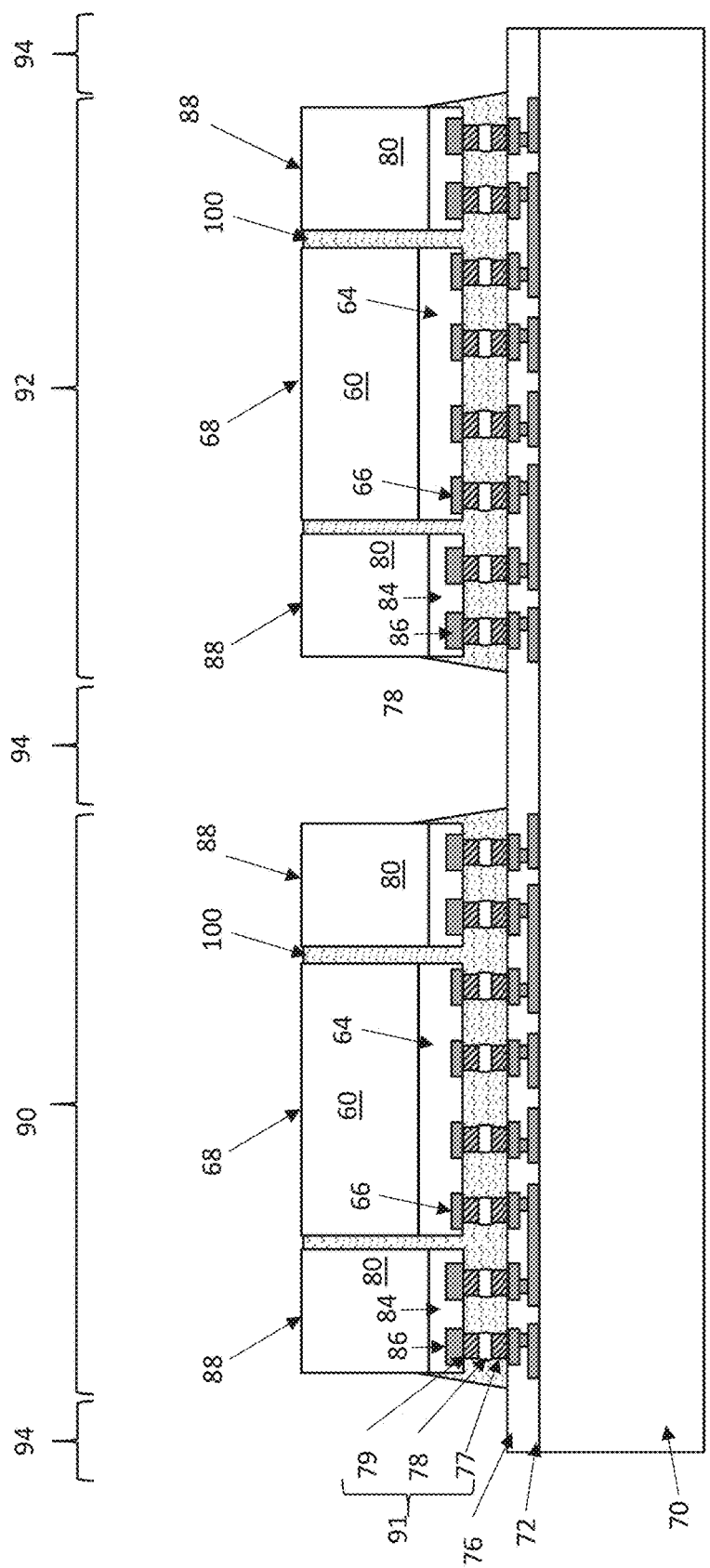

In FIG. 5, an underfill material 100 is dispensed into the gaps between the dies 68, the dies 88, and the redistribution structure 76. The underfill material 100 may extend up along sidewall of the dies 68 and the dies 88. The underfill material 100 may be any acceptable material, such as a polymer, epoxy, molding underfill, or the like. The underfill material 100 may be formed by a capillary flow process after the dies 68 and 88 are attached, or may be formed by a suitable deposition method before the dies 68 and 88 are attached.

Figure 6:
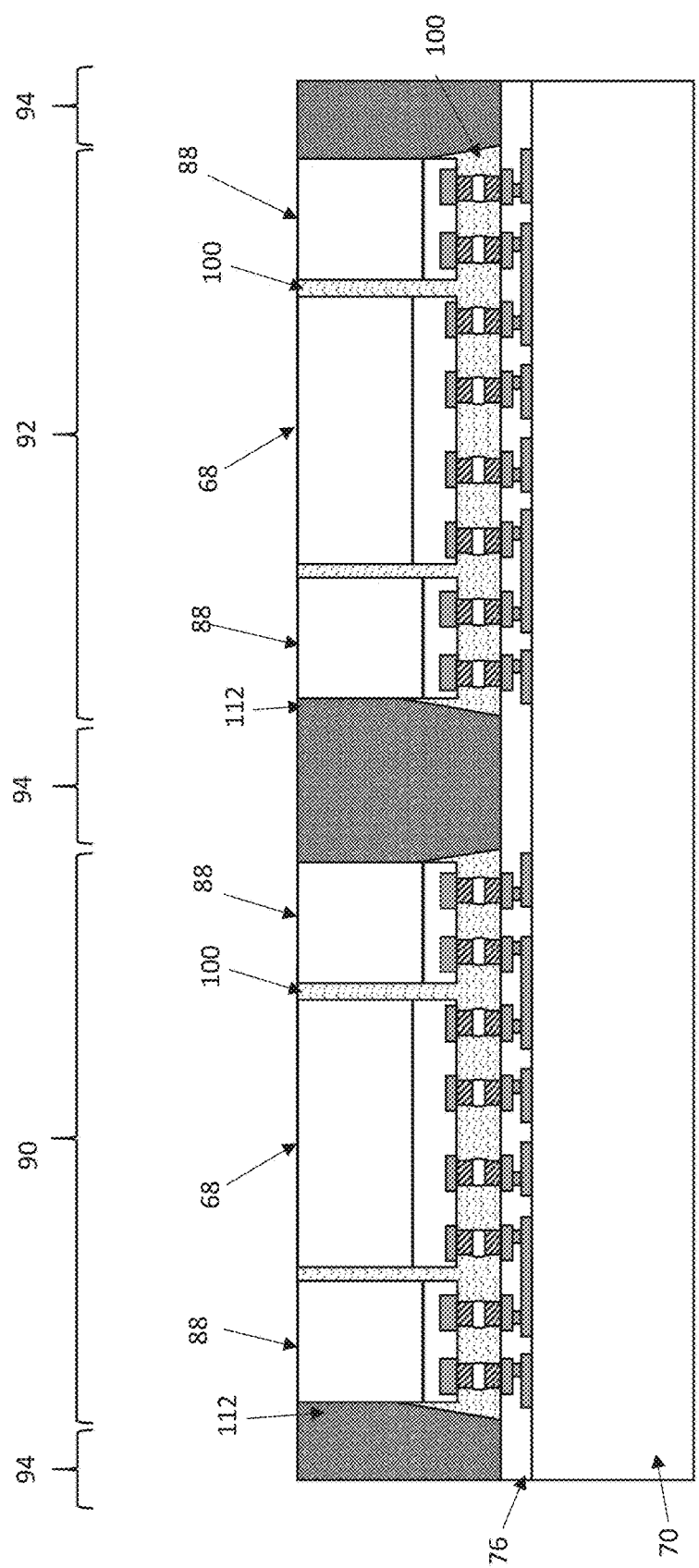
Figure 7:
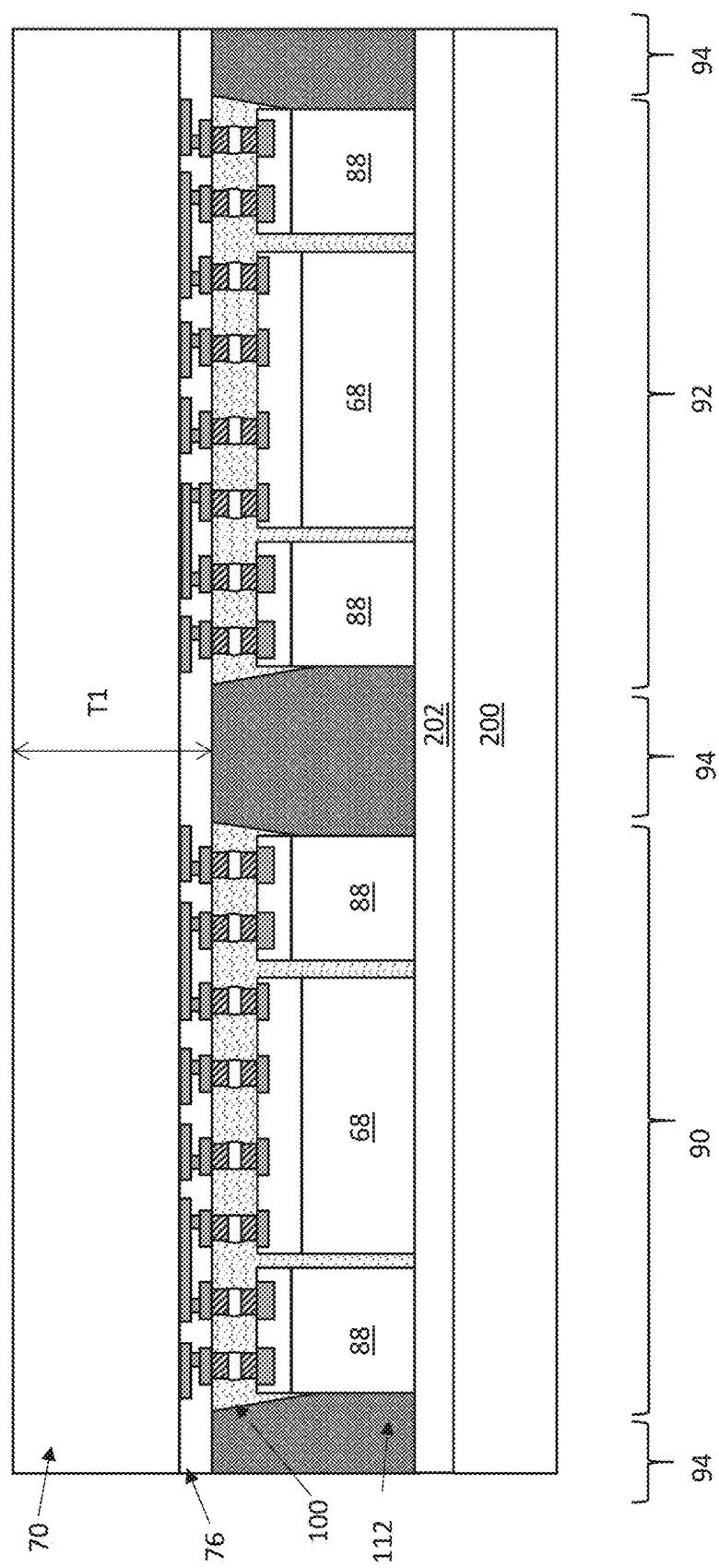
Figure 19:
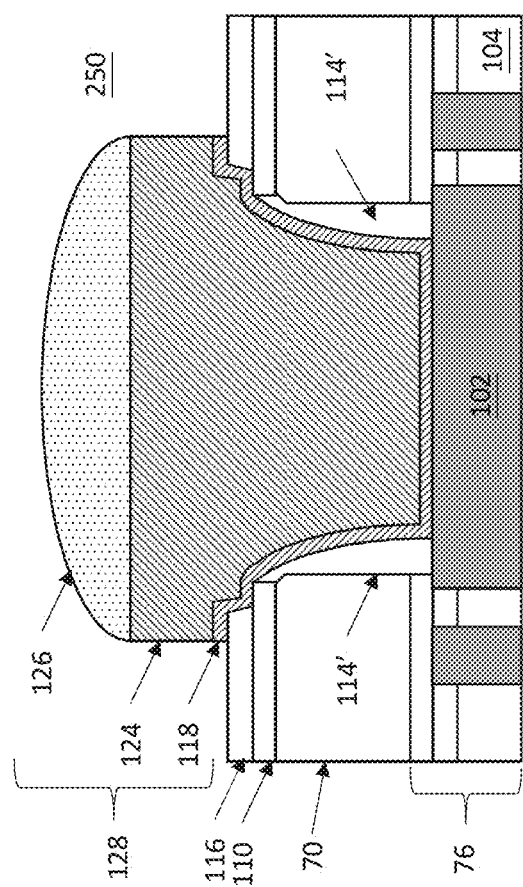
Figure 20:
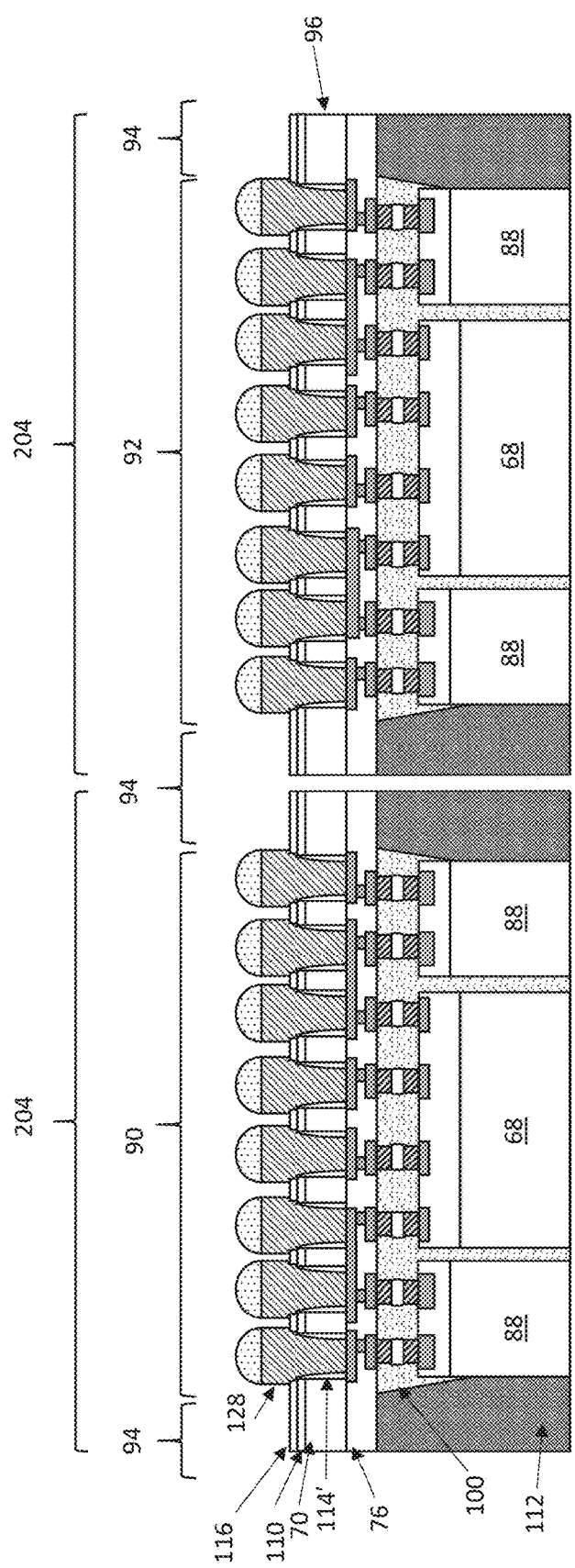

FIGS. 7 through 20 illustrate the formation of the second side of components 96 and through vias (TVs) 128 extending through the substrate 70 of the components 96 (see FIG. 20). In FIG. 7, the structure of FIG. 6 is flipped over to prepare for the formation of the second side of components 96. The structure may be placed on carrier substrate 200 or other suitable support structure for the process of FIGS. 7 through 20.

The carrier substrate 200 may be a glass carrier substrate, a ceramic carrier substrate, or the like. The structure of FIG. 6 may be attached to the carrier substrate 200 by a release layer 202. The release layer 202 may be formed of a polymer-based material, which may be removed along with the carrier substrate 200 from the overlying structures. In some embodiments, the release layer 202 is an epoxy-based thermal-release material, which loses its adhesive property when heated, such as a light-to-heat-conversion (LTHC) release coating. In other embodiments, the release layer 202 may be an ultra-violet (UV) glue, which loses its adhesive property when exposed to UV lights. The release layer 202 may be dispensed as a liquid and cured, may be a laminate film laminated onto the carrier substrate 200, or may be the like.

Figure 8:
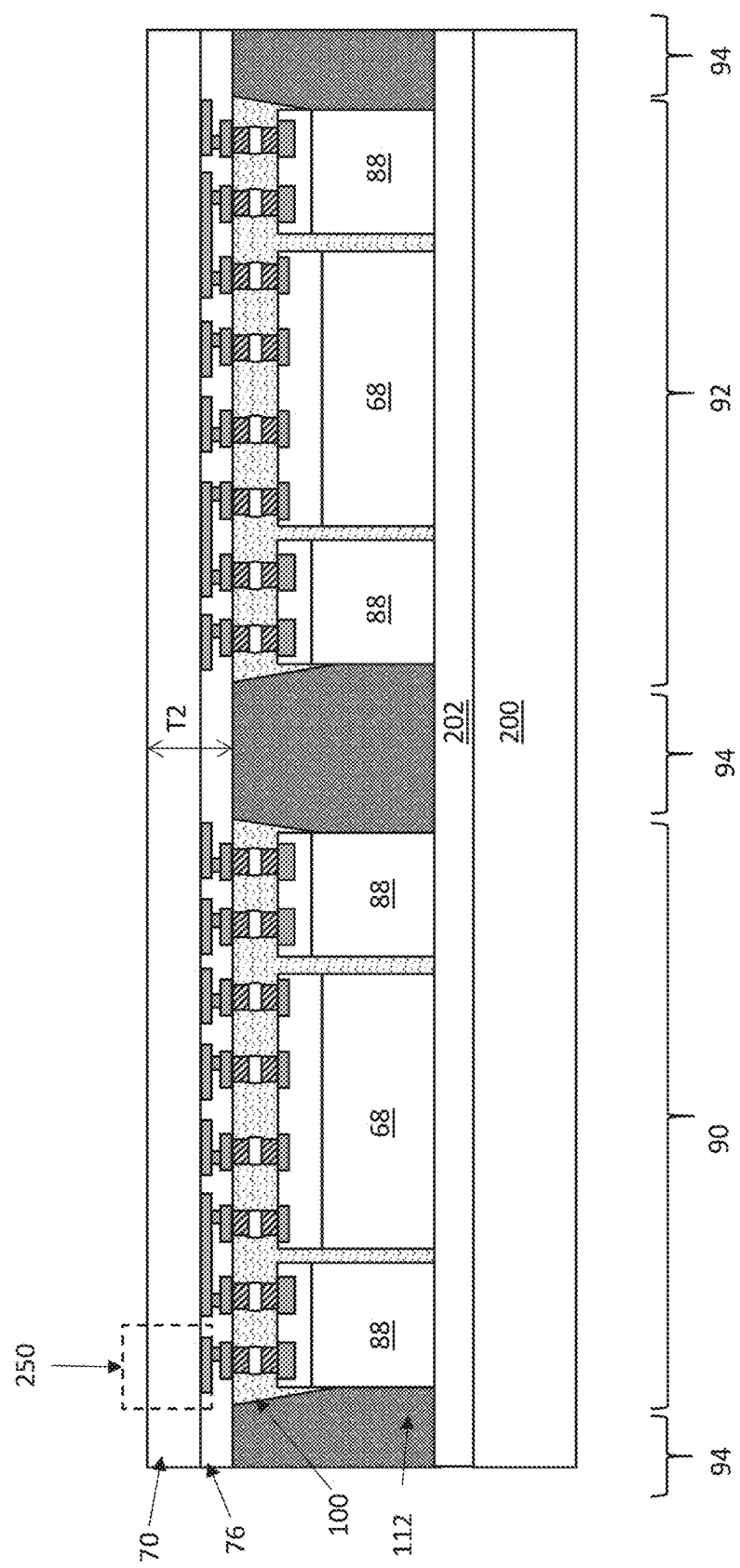

As shown in FIG. 7, at this stage of processing, the substrate 70 and redistribution structure 76 of the components 96 have a combined thickness T1 in a range from about 50 μm to about 775 μm. In FIG. 8, a thinning process is performed on the second side of the substrate 70 to thin the substrate 70. The thinning process may include an etching process, a grinding process, the like, or a combination thereof. In some embodiments, after the thinning process, the substrate 70 and redistribution structure 76 of the components 96 have a combined thickness T2 in a range from about 30 μm to about 200 μm, such as about 100 μm.

FIGS. 9 through 19 illustrate various intermediary stages of forming TVs 128 extending through the substrate 70 of the components 96. The TVs 128 can also be referred to as electrical connectors (e.g., µbumps), which allow the components 96 to be bonded to a package substrate in subsequent process steps (see FIG. 21). FIGS. 9 through 19 illustrate a detailed cross-sectional view of area 250 (see FIG. 8) of the structure of FIG. 8.

Figure 9:
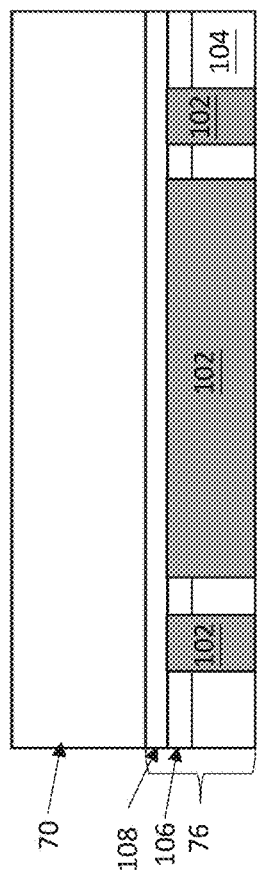

Referring to FIG. 9, details of area 250 are illustrated. Area 250 includes a portion of substrate 70 and a portion of the redistribution structure 76 as described above. For example, the redistribution structure 76 includes an IMD layer 104, which may comprise a low-k dielectric material as described above (e.g., USG). A metallization pattern 102 is formed within the IMD layer 104. In some embodiments, the metallization patterns 102 are conductive lines (e.g., comprising copper, aluminum, tungsten, silver, and combinations thereof), which provide electrical routing between the dies 68, the dies 88, and/or the package substrate 300 (see FIG. 21).

An insulating buffer layer 108 may be disposed between the metallization patterns 102 and the substrate 70. In some embodiments, the insulating buffer layer 108 provides electrical isolation between the metallization patterns 102 and the substrate 70. In some embodiments, the insulating buffer layer 108 comprises a low-K dielectric material, such as undoped silicate glass (USG), phosphosilicate glass (PSG), borophosphosilicate glass (BPSG), fluorosilicate glass (FSG), $SiO_xC_y$, Spin-On-Glass, Spin-On-Polymers, silicon carbon material, compounds thereof, composites thereof, combinations thereof, or the like. The insulating buffer layer 108 may be deposited by any suitable method known in the art, such as spinning, CVD, PECVD, HDP-CVD, or the like. The materials of the insulating buffer layer 108 and the IMD layer 104 may be the same or different. An etch stop layer 106 (e.g., silicon nitride, or the like) may be disposed between the IMD layer 104 and the insulating buffer layer 108. The etch stop layer 106 may be deposited by any suitable method known in the art, such as spinning, CVD, PECVD, HDP-CVD, or the like. The etch stop layer 106 may be used during the manufacturing of the metallization patterns 102 in order to provide an end point for etching openings in the IMD layer 104. As illustrated in FIG. 9, the metallization patterns 102 also extend through the etch stop layer 106. Thus, as part of forming the metallization patterns 102, the etch stop layer 106 may also be patterned using a suitable photolithography and etching process.

Figure 10:
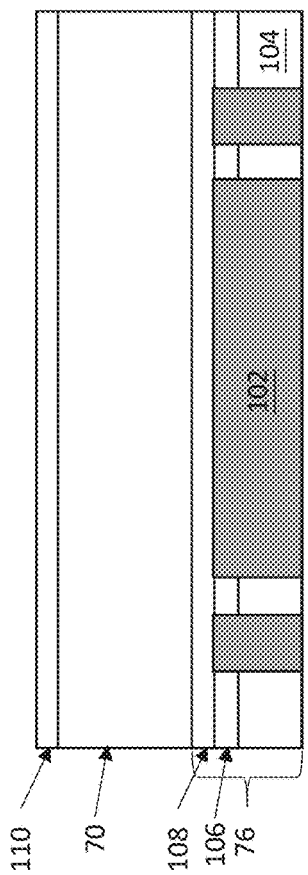

In FIG. 10, an insulating layer 110 is deposited on a backside of the substrate 70. For example, the insulating layer 110 may be disposed on an opposing side of the substrate 70 as the metallization patterns 102 and the IMD layer 104. In some embodiments, the insulating layer 110 comprises a silicon-comprising insulator, such as, silicon nitride, silicon oxide, silicon oxynitride, or the like. The insulating layer 110 may be deposited by any suitable method known in the art, such as spinning, CVD, PECVD, HDP-CVD, or the like. A thickness of the insulating layer 110 may be in the range of about 0.4 µm to about 1.0 µm.

Figure 11:
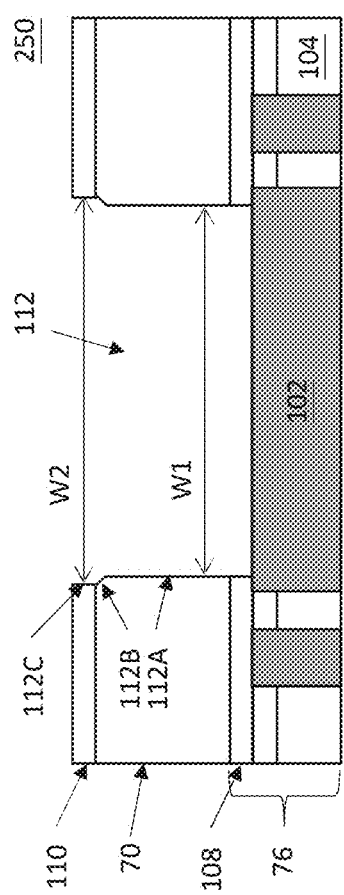

In FIG. 11, an opening 112 is patterned through the insulating layer 110, the substrate 70, and the insulating buffer layer 108. One opening 112 is illustrated in area 250 for ease of illustration, and it is understood that multiple openings 112 may be simultaneously patterned through the insulating layer 110, the substrate 70, and the buffer layer 108 in the structure of FIG. 8. The opening 112 may be patterned sequentially through the insulating layer 110, the substrate 70, and the insulating buffer layer 108 using, for example, a combination of photolithography and etching. For example, a photoresist (not illustrated) may be deposited over the insulating layer 110 by spinning, or the like. After deposition, the photoresist is then patterned, for example, by placing a patterned photomask over the photoresist, exposing portions of the photoresist using the photomask, and developing the photoresist to remove either exposed or unexposed portions of the photoresist (depending on whether a positive tone or negative tone resist is used). The pattern of the photoresist corresponds to the pattern of the openings 112. The insulating layer 110, the substrate 70, and the insulating buffer layer 108 are then sequentially etched using the photoresist as a mask. The type of etching process may depend on a material of the insulating layer 110, the substrate 70, and the insulating buffer layer 108. For example, because the substrate 70 and the insulating layer 110/the insulating buffer layer 108 are made of different materials, different etching processes may be used. For example, to etch the insulating layer 110, a dry etching process may be used. Example etchants for a dry etching process include $SF_6$ or the like. As another example, to etch the substrate 70, a dry etching process may be used. Example etchants for a dry etching process include $SF_6$ or the like. As another example, to etch the insulating buffer layer 108, a dry and/or wet etching process may be used. Example etchants for a dry etching process include $SF_6$ or the like. Example etchants for a wet etching process include hydrogen fluoride or the like.

Further, as a result of using different etching processes, a width of the opening 112 may not be the same through the insulating layer 110, the substrate 70, and the insulating buffer layer 108. For example, a width W2 of the opening 112 in the insulating layer 110 may be greater than a width W1 of the opening 112 in the substrate 70 and the insulating buffer layer 108. In some embodiments, the width W1 is in the range of about 15 µm to about 30 µm, and the width W2 is in the range of about 15.1 µm to about 30.3 µm. In other embodiments, the width W2 of the opening 112 in the insulating layer 110 may be equal to the width W1 of the opening 112 in the substrate 70 and the insulating buffer layer 108. Furthermore, the opening 112 may have sidewalls 112A and 112B in the substrate 70, and the opening 112 may have sidewalls 112C in the insulating layer 110. In some embodiments, the sidewalls 112B directly connect the sidewalls 112A to the sidewalls 112C. The sidewalls 112B may be disposed at a different angle relative a major surface of the substrate 70 than the sidewalls 112A and the sidewalls 112C. For example, a slope of the sidewalls 112B may be less than respective slopes of the sidewalls 112A and the sidewalls 112C relative the major surface of the substrate 70.

Other layers may be used in the patterning process to form the opening 112. For example, one or more optional hard mask layers may be used to pattern the insulating layer 110, the substrate 70, and the insulating buffer layer 108. Generally, one or more hard mask layers may be useful in embodiments in which the etching process requires masking in addition to the masking provided by the photoresist material. During subsequent etching process(es) to pattern the insulating layer 110, the substrate 70, the patterned photoresist mask will also be etched, although the etch rate of the photoresist material may not be as high as the etch rate of the insulating layer 110, the substrate 70, and the insulating buffer layer 108. If the etch process is such that the patterned photoresist mask may be consumed prior to completing the etching process on the insulating layer 110, the substrate 70, and the insulating buffer layer 108, then an additional hard mask may be utilized. The material of the hard mask layer or layers is selected such that the hard mask layer(s) exhibit a lower etch rate than the underlying materials, such as the materials of the insulating layer 110, the substrate 70, and/or the insulating buffer layer 108. After the openings 112 are patterned, any remaining residue of the optional hard mask layers and the photoresist may be removed.

Figure 12:
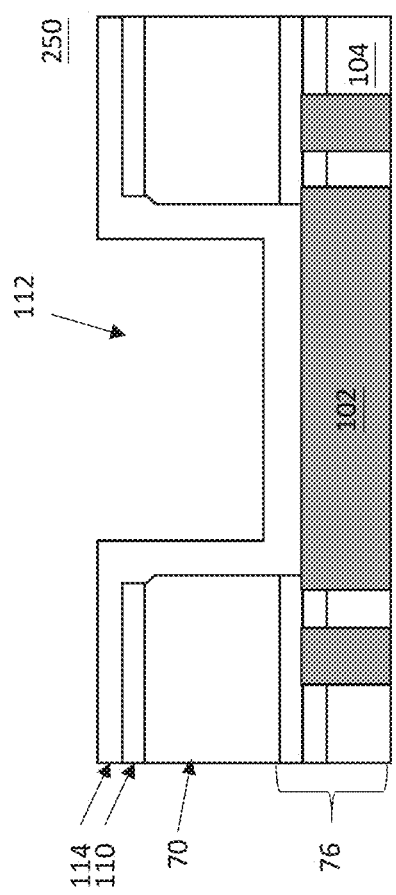

In FIG. 12, an insulating layer 114 is deposited over the insulating layer 110 and along sidewalls and a bottom surface of the openings 112. In some embodiments, the insulating layer 114 comprises a silicon-comprising insulator, such as, silicon nitride, silicon oxide, silicon oxynitride, or the like. A material of the insulating layer 114 may or may not be the same as the material of the insulating layer 110. Even in embodiments where the insulating layer 114 and the insulating layer 110 are made of a same material, interfaces may still be formed between the insulating layer 110 and the insulating layer 114 due to the separate deposition processes used to form the insulating layers 110 and 114. The insulating layer 114 may be deposited by any suitable method known in the art, such as, CVD, PECVD, HDP-CVD, or the like. In some embodiments, the insulating layer 114 is deposited using a conformal deposition process such that a thickness of lateral portions of the insulating layer 114 (e.g., portions outside of and over a bottom surface of the opening 112) is substantially equal to a thickness of vertical portions of the insulating layer 114 (e.g., portions along sidewalls of the opening 112). A thickness of the insulating layer 114 may be in the range of about 1 µm to about 5 µm.

Figure 13:
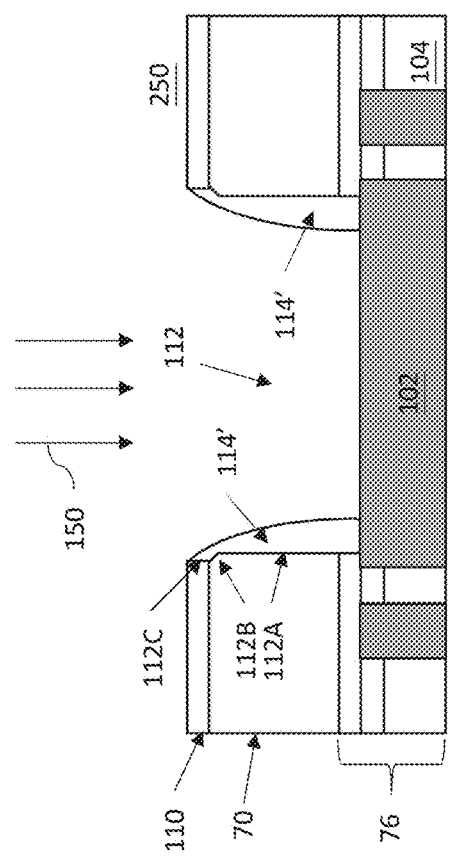

Referring next to FIG. 13, lateral portions of the insulating layer 114 are removed using a suitable etching process. In some embodiments, the etching may be anisotropic (e.g., directional in the direction indicated by arrows 150). Example anisotropic etch processes include a dry etch process using $SF_6$ or the like as etchants. As a result of the anisotropic etching processes, lateral portions of the insulating layer 114 are removed while vertical portions (e.g., portions on sidewalls of the opening 112) of the insulating layer 114 remains. Thus, sidewalls spacers 114' are formed along sidewalls 112A, 112B, and 112C of the opening 112. For example, the sidewall spacers 114' may form interfaces with sidewalls of the insulating layer 110 and sidewalls of the substrate 70. The sidewalls spacers 114' may have an annular shape in a top-down view (not provided).

Patterning the insulating layer 114 to define the sidewall spacers 114' may not require the use of any photolithography processes or mask layers. For example, because the insulating layer 110 is already formed and patterned prior to forming the insulating layer 114, a directional etching process may be used to pattern the insulating layer 114 across an entirety of the wafer comprising the substrate 70 without needing to mask off different areas of the wafer. A timed etching process can be used so that the structure includes a substrate 70 covered along a top surface and sidewalls by insulating materials (e.g., the insulating layer 110 and the sidewall spacers 114'). Thus, manufacturing costs can be reduced.

Figure 14:
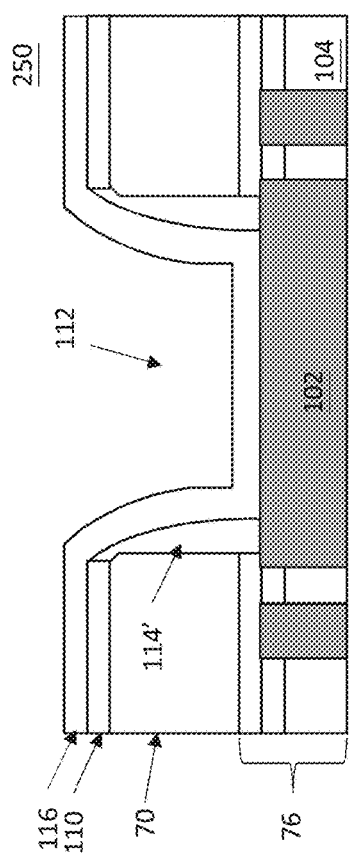

In FIG. 14, a stress buffer layer 116 is deposited. The stress buffer layer 116 may be deposited by any suitable method known in the art, such as, CVD, PECVD, HDP-CVD, or the like. In some embodiments, the stress buffer layer 116 is deposited using a conformal deposition process such that a thickness of lateral portions of the stress buffer layer 116 (e.g., portions outside of and over a bottom surface of the opening 112) is substantially equal to a thickness of vertical portions of the stress buffer layer 116 (e.g., portions along sidewalls of the opening 112). In other embodiments, the stress buffer layer 116 may be deposited using a non-conformal process, such as a spinning. The stress buffer layer 116 may comprise a different material than the insulating layer 110 and the sidewall spacers 114'. For example, in some embodiments, the stress buffer layer 116 comprises a polymer, such as polybenzoxazole (PBO), polyimide, benzocyclobutene (BCB), or the like. In some embodiments, the stress buffer layer 116 is deposited as a photosensitive layer while the insulating layer 110 and the sidewall spacers 114' are not deposited as photosensitive layers. Although FIG. 14 illustrates the stress buffer layer 116 as a single layer, in other embodiments, the stress buffer layer 116 may be a multi-layered structure comprising, for example, a plurality of stacked polymer layers. In such embodiments, each of the plurality of stacked polymer layers may comprise a different material.

Figure 15:
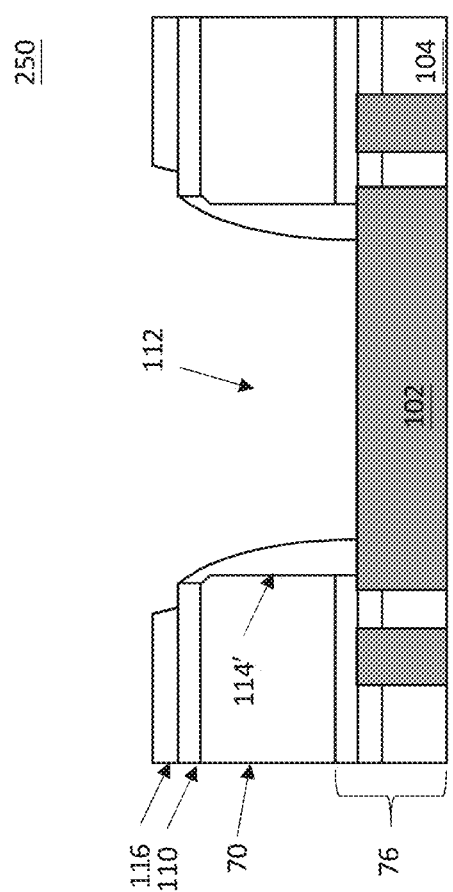
Figure 16:
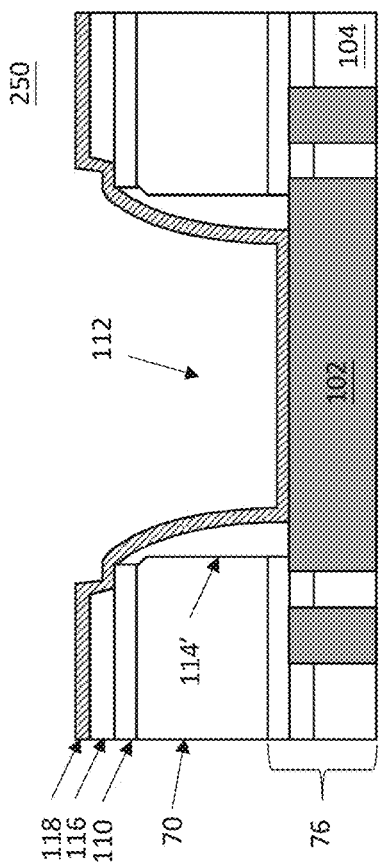

In FIG. 15, the stress buffer layer 116 is patterned to remove portions of the stress buffer layer 116 in the opening 112 and to extend the opening 112 into the stress buffer layer 116. Patterning the stress buffer layer 116 may further expose portions of the insulating layer 110. Patterning the stress buffer layer 116 can be performed using any suitable process. For example, when the stress buffer layer 116 comprises a photosensitive material (e.g., PBO), the stress buffer layer 116 may be patterned using a lithography process. In such embodiments, after patterning, a curing may be performed on the stress buffer layer 116 after patterning to harden the stress buffer layer 116. In some embodiments, the stress buffer layer 116 may comprise a polymer having a relatively low curing temperature (e.g., less than about 200° C.) in order to reduce exposing the other components of the structure (e.g., the dies 68 and the dies 88, see FIG. 8) to high temperatures and risking damage to these components during curing. After curing, the stress buffer layer 116 may no longer be photosensitive. In other embodiments, the stress buffer layer 116 is not deposited a photosensitive layer and a combination of photolithography and etching may be used to pattern the stress buffer layer 116 with one or more masks.

In FIGS. 16 through 18A and 18B, a conductive feature is formed through the opening 112. As an example to form the conductive feature, a seed layer 118 is formed over the stress buffer layer 116 and along sidewalls/a bottom surface of the opening 112 in FIG. 16. In some embodiments, the seed layer 118 is a metal layer, which may be a single layer or a composite layer comprising a plurality of sublayers formed of different materials. In some embodiments, the seed layer comprises a titanium layer and a copper layer over the titanium layer. The seed layer may be formed using, for example, PVD or the like.

Figure 17:
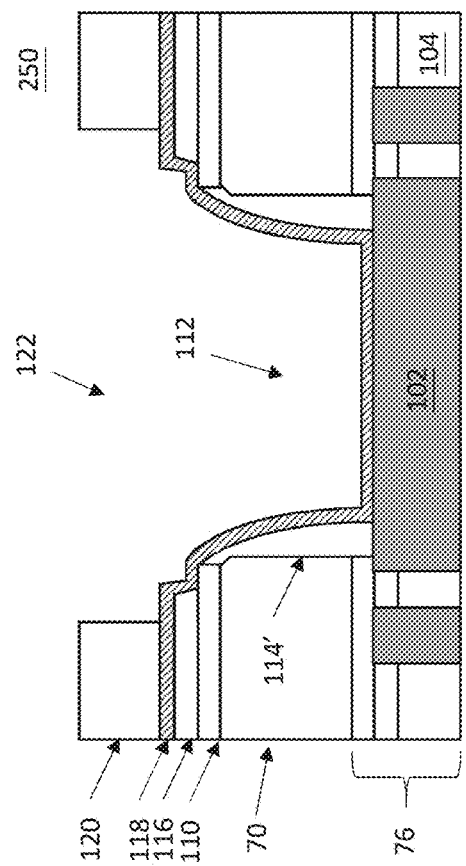

Next, in FIG. 17, a photoresist 120 is formed and patterned on the seed layer 118. The photoresist may be patterned to include an opening 122, which exposes portions of the seed layer 118 in the opening 112. At least a portion of the seed layer 118 over the stress buffer layer 116 may also be exposed in the opening 122. The pattern of the photoresist corresponds to the pattern of the subsequently formed conductive feature (e.g., conductive feature 124, see FIG. 18A).

Figure 18A:
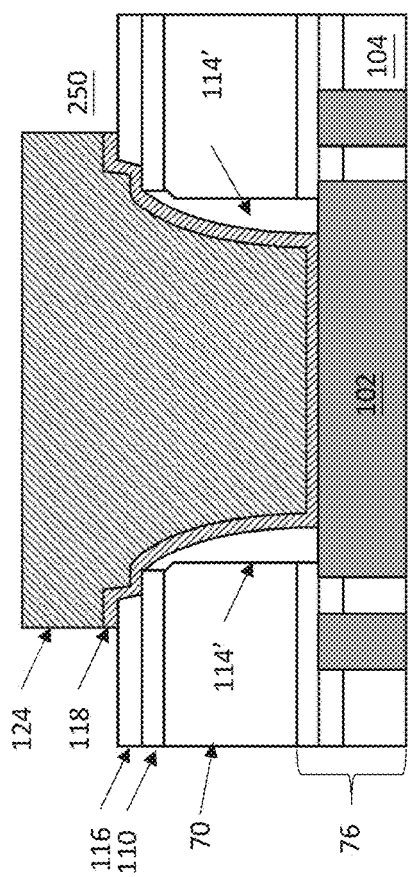
Figure 18B:
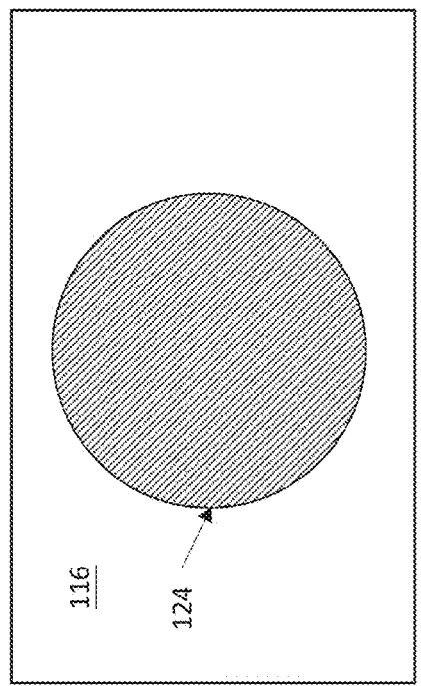

In FIG. 18A, a conductive feature 124 is formed in the opening 112 (see FIG. 17) and the opening 122 (see FIG. 17) on the exposed portions of the seed layer 118. The conductive feature 124 may be formed by plating, such as electroplating or electroless plating, or the like. The conductive feature 124 may comprise a metal, like copper, titanium, tungsten, aluminum, or the like. After the conductive feature 124 is formed, the photoresist 120 (see FIG. 17) and portions of the seed layer 118 on which the conductive feature 124 is not formed are removed. The photoresist 120 may be removed by an acceptable ashing or stripping process, such as using an oxygen plasma or the like. Once the photoresist 120 is removed, exposed portions of the seed layer 118 are removed, such as by using an acceptable etching process, such as by wet or dry etching. In a top-down view (see FIG. 18B), the resulting conductive feature 124 may have a circular or ovular shape. In other embodiments, other shapes for the conductive feature 124 are also contemplated. The sidewall spacers 114' (not shown in FIG. 18B) may encircle, physically separate, and insulate the conductive feature from the substrate 70 in a top-down view.

In FIG. 19, a solder region 126 is formed over the conductive feature 124. In some embodiments, the solder region 126 is formed by initially forming a layer of solder through such suitable methods such as evaporation, electroplating, printing, solder transfer, ball placement, or the like. Once the layer of solder has been formed on the conductive feature 124, a reflow may be performed in order to shape the material into the desired bump shapes.

Thus, a TV 128 is formed extending through the stress buffer layer 116, the insulating layer 110, and the substrate 70. The TV 128 comprises the solder region 126, the conductive feature 124, and the seed layer 118. In various embodiments, the TV 128 is electrically connected to the metallization patterns 102 in the IMD layer 104. The insulating layer 110 and the sidewall spacers 114' electrically insulate the TVs 128 from the substrate 70 and other TVs 128 extending through the substrate 70 (see FIG. 20). In some embodiments, the TV 128 also functions as a μbump, which can be used to bond the substrate 70 to another package feature (e.g., package substrate 300, see FIG. 21). Further, due to the material of the sidewall spacers 114', sidewall spacers 114' may provide improved structural support for the TV 128. Thus, when the TV 128 is bonded to another package feature (e.g., a thermal process), manufacturing defects (e.g., deformation of the TV 128) can be reduced. Manufacturing defects may be similarly reduced in subsequent testing cycles (e.g., reliability stress testing).

FIG. 20 illustrates a zoomed out view of the wafer comprising the substrate 70 after the TVs 128 are formed. Each of the TVs 128 is formed using the processes described above with respect to FIGS. 9 through 19. As illustrated by FIG. 20, the TVs 128 are electrically connected to the dies 68 and the dies 88 by metallization patterns in the redistribution structure 76.

As further illustrated by FIG. 20, a carrier de-bonding is performed to detach (de-bond) the carrier substrate 200 from the dies 68, the dies 88, and the molding compound 120. In accordance with some embodiments, the de-bonding includes projecting a light such as a laser light or an UV light on the release layer 202 so that the release layer 202 decomposes under the heat of the light and the carrier substrate 200 can be removed. The structure is then flipped over and placed on a tape (not illustrated). Subsequently, components 96 are singulated between adjacent regions 90 and 92 along scribe line regions 94 to form component packages 204 comprising, among other things, a die 68, a component 96, and dies 88. The singulation may be by sawing, dicing, or the like.

FIG. 21 illustrates a semiconductor device package 400 formed by the attachment of a component package 204 on a substrate 300. TVs 128 aligned to, and are put against, bond pads 302 of the substrate 300. The TVs 128 may be reflowed to create a bond between the substrate 300 and the component 96. The substrate 300 may comprise a package substrate, such as a build-up substrate including a core therein, a laminate substrate including a plurality of laminated dielectric films, a PCB, or the like. The substrate 300 may comprise electrical connectors (not shown), such as solder balls, opposite the component package to allow the substrate 300 to be mounted to another device. An underfill material (not shown) can be dispensed between the component package 204 and the substrate 300 and surrounding portions of the TVs 128 protruding from the substrate 70, the insulating layer 110, and the stress buffer layer 116. The underfill material may be any acceptable material, such as a polymer, epoxy, molding underfill, or the like.

In some embodiments, the stress buffer layer 116 is included to absorb stress caused by the bonding process between the component package 204 and the substrate 300. Further, as described above, the sidewall spacers 114' and the insulating layer 110 may comprise materials which reduce deformation of the TVs 128 during thermal processes (e.g., bonding the component package 204 to the substrate 300).

Additionally, one or more surface devices 304 may be connected to the substrate 300. The surface devices 304 may be used to provide additional functionality or programming to the component package 204, or the package as a whole. In an embodiment, the surface devices 304 may include surface mount devices (SMDs) or integrated passive devices (IPDs) that include passive devices such as resistors, inductors, capacitors, jumpers, combinations of these, or the like that are desired to be connected to and utilized in conjunction with component package 204, or other parts of the package. The surface devices 304 may be placed on a first major surface of the substrate 300, an opposing major surface of the substrate 300, or both, according to various embodiments.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Embodiments of the device and methods in the current disclosure have many advantages. For example, the semiconductor substrate (e.g., substrate 70) of a component (e.g., component 96) may be thinned during manufacturing. Due to the thinness of the semiconductor substrate, the conductive vias (e.g., TVs 128) extending through the semiconductor substrate are at an increased risk of deformation (e.g., delamination) during thermal processing of the device package (e.g., reliability/stress testing, reflow/bonding to the package substrate, and the like). Various embodiments provide an insulating spacer (e.g., sidewall spacers 114') on sidewalls of the conductive via to improve the rigidity of the conductive via and reduce manufacturing defects. In some embodiments, the insulating spacer may insulate the conductive via from the semiconductor substrate of the interposer as well as provide increased structure support for the conductive vias, which reduces manufacturing defects during subsequent thermal processes (e.g., bonding and/or reliability testing).

In accordance with an embodiment, a method includes bonding a first die to a first side of an interposer, the interposer comprising a substrate; depositing a first insulating layer on a second side of the interposer opposite the first side; patterning an opening through the substrate and the first insulating layer; depositing a second insulating layer over the first insulating layer and along sidewalls and a lateral surface of the opening, the second insulating layer comprising silicon; removing lateral portions of the second insulating layer to define a sidewall spacer on sidewalls of the opening; and forming a through via in the opening, wherein the through via is electrically connected to the first die. In an embodiment, the interposer is a component of a wafer while bonding the first die to the first side of the interposer, and the method further includes after forming the through via in the opening, singulating interposer from the wafer. In an embodiment, removing the lateral portions of the second insulating layer comprises an anisotropic etching process without using any patterning masks. In an embodiment, removing the lateral portions of the second insulating layer exposes the first insulating layer. In an embodiment, the first insulating layer and the second insulating layer are made of a same material and each comprise silicon nitride. In an embodiment, the method further includes prior to forming a through via in the opening, forming a stress buffer layer over the first insulating layer; the stress buffer layer comprises a different material than the first insulating layer and the second insulating layer. In an embodiment, forming the through via includes depositing a seed layer along sidewalls and a bottom surface of the opening; plating a conductive feature on the seed layer, wherein the conductive feature extends through the substrate and the first insulating layer; and forming a solder region on a surface of the conductive feature opposite the seed layer. In an embodiment, the method further includes bonding the interposer to a package substrate; the solder region is directly bonded to a contact pad of the package substrate.

In accordance with an embodiment, a method includes bonding a first die and a second die to an interposer, the interposer including a redistribution structure comprising one or more metallization patterns electrically connecting the first die to the second die; and a substrate on an opposing side of the redistribution structure as the first die and the second die. The method further includes depositing a first silicon-comprising insulating layer on a surface of substrate opposite the redistribution structure; patterning a first opening extending through the first silicon-comprising insulating layer and the substrate, the first opening exposing a first metallization pattern of the one or more metallization patterns; forming sidewall spacers along sidewalls of the first opening, the sidewall spacers comprising a silicon-comprising insulating material; forming an electrical connector extending through the first opening and electrically connected to the first metallization pattern; and bonding a package substrate to the interposer using the electrical connector. In an embodiment, the method further includes after forming the sidewall spacers, depositing an insulating buffer layer over the first silicon-comprising insulating layer; the insulating buffer layer comprises a polymer; and extending the first opening into the insulating buffer layer. In an embodiment, forming the sidewall spacers includes depositing a second silicon-comprising insulating layer over the first silicon-comprising insulating layer, along sidewalls of the first opening, and over a bottom surface of the first opening; and patterning the second silicon-comprising insulating layer using an anisotropic etching process to remove lateral portions of the second silicon-comprising insulating layer and define the sidewall spacers. In an embodiment, the sidewall spacers forms a first interface with the substrate and a second interface with the first silicon-comprising insulating layer, the first interface being laterally spaced apart from the second interface. In an embodiment, the sidewall spacers forms a third interface with the substrate, the third interface being disposed between the first interface and the second interface, a slope of the third interface being less than a slope of the first interface and a slope of the second interface relative a major surface of the substrate. In an embodiment, the first silicon-comprising insulating layer comprises silicon nitride, silicon oxide, or silicon oxynitride, and the sidewall spacers comprise silicon nitride, silicon oxide, or silicon oxynitride. In an embodiment, forming the electrical connector includes depositing seed layer along sidewalls of the sidewall spacers and over the first metallization pattern; plating a conductive feature extending from the seed layer to outside of the first opening; and forming a solder region on the conductive feature. In an embodiment, the method further includes dispensing an underfill between the first die and the interposer, the underfill further extending between the second die and the interposer; and encapsulating the first die, the second die, and the underfill in a molding compound. In an embodiment, patterning the first opening extending through the first silicon-comprising insulating layer and the substrate includes patterning the first opening wider in the first silicon-comprising insulating layer than the substrate.

In accordance with an embodiment, a package includes a first die bonded to an interposer, the interposer including a metallization pattern electrically connected to the first die; and a substrate on an opposite side of the metallization pattern as the first die. The package further includes a silicon-comprising insulating layer on a surface of the substrate opposite the metallization pattern; a polymer layer on an opposing side of the silicon-comprising insulating layer as the substrate; a through via extending through the polymer layer, the silicon-comprising insulating layer, and the substrate to the metallization pattern; and a silicon-comprising sidewall spacer between the through via and the substrate, the silicon-comprising sidewall spacer is further disposed between the through via and the silicon-comprising insulating layer. In an embodiment, the silicon-comprising sidewall spacer forms a first interface with and is made of a same material as the silicon-comprising insulating layer. In an embodiment, the silicon-comprising sidewall spacer forms a second interface with the substrate, the first interface being laterally spaced apart from the second interface. In an embodiment, the through via includes a conductive feature extending through the polymer layer, the silicon-comprising insulating layer, and the substrate; and a solder region on an opposing side of the conductive feature as the metallization pattern, wherein the solder region is directly bonded to a contact pad of a package substrate. In an embodiment, the silicon-comprising sidewall spacer comprises silicon oxide, silicon nitride, or silicon oxynitride.

In accordance with an embodiment, a package includes a first die and a second die bonded to an package component, the package component including a redistribution structure comprising one or more layers of metallization patterns providing electrical routing between the first die and the second die; and a substrate on an opposite side of the redistribution structure as the first die and the second die. The package further includes a first insulating layer on a side of the substrate opposite the redistribution structure, the first insulating layer comprising silicon nitride, silicon oxide, or silicon oxynitride; a sidewall spacer along sidewalls of the first insulating layer and the substrate, wherein the sidewall spacer comprises silicon nitride, silicon oxide, or silicon oxynitride; and an electrical connector extending through the first insulating layer and the substrate, the sidewall spacer insulating the electrical connector from the substrate, wherein the electrical connector is electrically connected to a first one of the metallization patterns. In an embodiment, the package further includes a second insulating layer on an opposing side of the first insulating layer as the substrate, the second insulating layer comprising a different material than the first insulating layer. In an embodiment, the sidewall spacer includes a first sidewall having a first slope in the first insulating layer; a second sidewall having a second slope in the substrate; and a third sidewall connecting the first sidewall to the second sidewall, the third sidewall having a third slope less than the first slope and the second slope relative a major surface of the substrate. In an embodiment, the package component is an interposer free of any active devices.

In accordance with an embodiment, an interposer includes a metallization pattern in a first dielectric layer; a substrate over the first dielectric layer; a first insulating layer over the substrate, the first insulating layer comprising silicon nitride, silicon oxide, or silicon oxynitride; a sidewall spacer along sidewalls of the first insulating layer and the substrate, wherein the sidewall spacer comprises silicon nitride, silicon oxide, or silicon oxynitride. The sidewall spacer includes a first sidewall having a first slope in the first insulating layer; a second sidewall having a second slope in the substrate; and a third sidewall connecting the first sidewall to the second sidewall, the third sidewall having a third slope less than the first slope and the second slope relative a major surface of the substrate; and an electrical connector extending through the first insulating layer and the substrate, the sidewall spacer being disposed between the electrical connector and the substrate. The electrical connector is electrically connected to the metallization pattern. In an embodiment, the interposer further includes a second insulating layer between the first insulating layer and the first dielectric layer, the sidewall spacer extends through the second insulating layer.

In accordance with an embodiment, a method includes depositing a first insulating layer over a substrate of an interposer free of any active devices, the first insulating layer is disposed on a side of the substrate opposite a redistribution structure; patterning an opening through the substrate and the first insulating layer; depositing a second insulating layer over the first insulating layer and along sidewalls and a lateral surface of the opening, wherein the second insulating layer comprises silicon oxide, silicon nitride, or silicon oxynitride; removing lateral portions of the second insulating layer to define a sidewall spacer on sidewalls of the opening; and forming an external connector in the opening, wherein the external connector is electrically connected to a metallization pattern in the redistribution structure. In an embodiment, the method further includes bonding a first die to a first side of the interposer and bonding a package substrate to a second side of the interposer opposite the first side, a solder region of the external connector is directly bonded to a contact pad of the package substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    bonding a first die to a first side of an interposer, the interposer comprising a substrate, and the interposer is free of any active devices;
    depositing a first insulating layer on a second side of the interposer opposite the first side;
    patterning an opening through the substrate and the first insulating layer;
    depositing a second insulating layer over the first insulating layer and along sidewalls and a lateral surface of the opening, the second insulating layer comprising silicon;
    removing lateral portions of the second insulating layer to define a sidewall spacer on sidewalls of the opening; and
    forming a through via in the opening, wherein the through via is electrically connected to the first die.

2. The method of claim 1, wherein the interposer is a component of a wafer while bonding the first die to the first side of the interposer, and wherein the method further comprises: after forming the through via in the opening, singulating interposer from the wafer.

3. The method of claim 1, wherein removing the lateral portions of the second insulating layer comprises an anisotropic etching process without using any patterning masks.

4. The method of claim 1, wherein removing the lateral portions of the second insulating layer exposes the first insulating layer.

5. The method of claim 1, wherein the first insulating layer and the second insulating layer are made of a same material and each comprise silicon nitride.

6. The method of claim 1 further comprising prior to forming a through via in the opening, forming a stress buffer layer over the first insulating layer, wherein the stress buffer layer comprises a different material than the first insulating layer and the second insulating layer.

7. The method of claim 1 wherein forming the through via comprises:
    depositing a seed layer along sidewalls and a bottom surface of the opening;
    plating a conductive feature on the seed layer, wherein the conductive feature extends through the substrate and the first insulating layer; and
    forming a solder region on a surface of the conductive feature opposite the seed layer.

8. The method of claim 7 further comprising bonding the interposer to a package substrate, wherein the solder region is directly bonded to a contact pad of the package substrate.

9. A method comprising:
    bonding a first die and a second die to an interposer, the interposer comprising:
        a redistribution structure comprising one or more metallization patterns electrically connecting the first die to the second die; and
        a substrate on an opposing side of the redistribution structure as the first die and the second die;
    depositing a first silicon-comprising insulating layer on a surface of substrate opposite the redistribution structure;
    patterning a first opening extending through the first silicon-comprising insulating layer and the substrate, the first opening exposing a first metallization pattern of the one or more metallization patterns;

forming sidewall spacers along sidewalls of the first opening, the sidewall spacers comprising a silicon-comprising insulating material;

forming an electrical connector extending through the first opening and electrically connected to the first metallization pattern; and bonding a package substrate to the interposer using the electrical connector.

10. The method of claim 9 further comprising:

after forming the sidewall spacers, depositing an insulating buffer layer over the first silicon-comprising insulating layer, the insulating buffer layer comprises a polymer; and extending the first opening into the insulating buffer layer.

11. The method of claim 9, wherein forming the sidewall spacers comprises:

depositing a second silicon-comprising insulating layer over the first silicon-comprising insulating layer, along sidewalls of the first opening, and over a bottom surface of the first opening; and patterning the second silicon-comprising insulating layer using an anisotropic etching process to remove lateral portions of the second silicon-comprising insulating layer and define the sidewall spacers.

12. The method of claim 9, wherein the sidewall spacers forms a first interface with the substrate and a second interface with the first silicon-comprising insulating layer, the first interface being laterally spaced apart from the second interface.

13. The method of claim 12, wherein the sidewall spacers forms a third interface with the substrate, the third interface being disposed between the first interface and the second interface, a slope of the third interface being less than a slope of the first interface and a slope of the second interface relative a major surface of the substrate.

14. The method of claim 9, wherein the first silicon-comprising insulating layer comprises silicon nitride, silicon oxide, or silicon oxynitride, and wherein the sidewall spacers comprise silicon nitride, silicon oxide, or silicon oxynitride.

15. The method of claim 9, wherein forming the electrical connector comprises:

depositing seed layer along sidewalls of the sidewall spacers and over the first metallization pattern;

plating a conductive feature extending from the seed layer to outside of the first opening; and forming a solder region on the conductive feature.

16. The method of claim 9 further comprising:

dispensing an underfill between the first die and the interposer, the underfill further extending between the second die and the interposer; and encapsulating the first die, the second die, and the underfill in a molding compound.

17. The method of claim 9, wherein patterning the first opening extending through the first silicon-comprising insulating layer and the substrate comprises patterning the first opening wider in the first silicon-comprising insulating layer than the substrate.

18. A method comprising:

bonding a first die an interposer, the interposer comprising:

a metallization pattern electrically connected to the first die; and a semiconductor substrate on an opposite side of the metallization pattern as the first die;

depositing a silicon-comprising insulating layer on a surface of the semiconductor substrate opposite the metallization pattern;

patterning an opening through the silicon-comprising insulating layer and the semiconductor substrate, a first portion of the opening in the silicon-comprising insulating layer has a first width measured at an interface between the silicon-comprising insulating layer and the semiconductor substrate, a second portion of the opening in the semiconductor substrate having a second width measured at a surface of the semiconductor substrate opposite the silicon-comprising insulating layer, the first width is greater than the second width;

forming a silicon-comprising sidewall spacer on a sidewall of the opening;

depositing a polymer layer on an opposing side of the silicon-comprising insulating layer as the semiconductor substrate; and forming a through via extending through the polymer layer, the silicon-comprising insulating layer, and the semiconductor substrate to the metallization pattern, wherein the silicon-comprising sidewall spacer is disposed between the through via and the silicon-comprising insulating layer.

19. The method of claim 18, wherein the silicon-comprising sidewall spacer forms a first interface with and is made of a same material as the silicon-comprising insulating layer.

20. The method of claim 18, further comprising extending the opening into the polymer layer, wherein a third portion of the opening in the polymer layer has a third width that is wider than the first width.

* * * * *